United States Patent [19]

Nakamura

[11] Patent Number: 4,993,360

[45] Date of Patent: Feb. 19, 1991

[54] VAPOR GROWTH APPARATUS HAVING A DIFFUSER SECTION CONTAINING A FLOW REGULATING MEMBER

[75] Inventor: Yoshiaki Nakamura, Yokohama, Japan

[73] Assignee: Kasbushiki Kaisha Toshiba, Kawasaki, Japan

[21] Appl. No.: 327,895

[22] Filed: Mar. 23, 1989

[30] Foreign Application Priority Data

Mar. 28, 1988 [JP] Japan .................................. 63-71845

[51] Int. Cl.⁵ .............................................. C23C 16/00
[52] U.S. Cl. ..................................... 118/719; 118/715; 118/728; 239/592
[58] Field of Search ................ 118/50, 715, 719, 728; 156/345, 646; 239/590.3, 590.5, 592

[56] References Cited

U.S. PATENT DOCUMENTS

| | | | |
|---|---|---|---|
| 3,996,025 | 12/1976 | Gulden | 48/107 |
| 4,825,809 | 5/1989 | Mieno | 118/728 |

FOREIGN PATENT DOCUMENTS

| | | | |
|---|---|---|---|
| 58-56339 | 4/1983 | Japan | 156/345 |
| 60-81093 | 5/1985 | Japan | |
| 61-130486 | 6/1986 | Japan | 118/715 |
| 61-180424 | 8/1986 | Japan | 156/611 |
| 62-51211 | 3/1987 | Japan | 118/715 |
| 62-58619 | 3/1987 | Japan | 118/715 |

OTHER PUBLICATIONS

Viva, O. R., "Obtaining Improved Gas Flow in Diffusion Apparatus", IBM Technical Disclosure Bulletin, vol. 14, No. 9 (Feb. 1972), p. 2550.

Primary Examiner—Norman Morgenstern
Assistant Examiner—Terry J. Owens
Attorney, Agent, or Firm—Oblon, Spivak, McClelland, Maier & Neustadt

[57] ABSTRACT

A vapor growth apparatus comprising a reaction chamber including a gas inlet, a diffuser section, the cross section of which gradually increases in a direction of the flow of gas supplied from the gas inlet, and a reaction chamber, which is coupled to the diffuser section and in which a substrate on which a thin film is to be formed is arranged, and a flow regulating member arranged, within the diffuser section, to make the flow speed of gas passing over the substrate uniform in a direction perpendicular to the direction of the flow of the gas. The flow speed of gas flowing over the substrate is made uniform in a direction perpendicualr to the direction of the flow of the gas, so that a thin film can be uniformly formed on the substrate in a direction perpendicular to the direction of the flow of the gas.

11 Claims, 4 Drawing Sheets

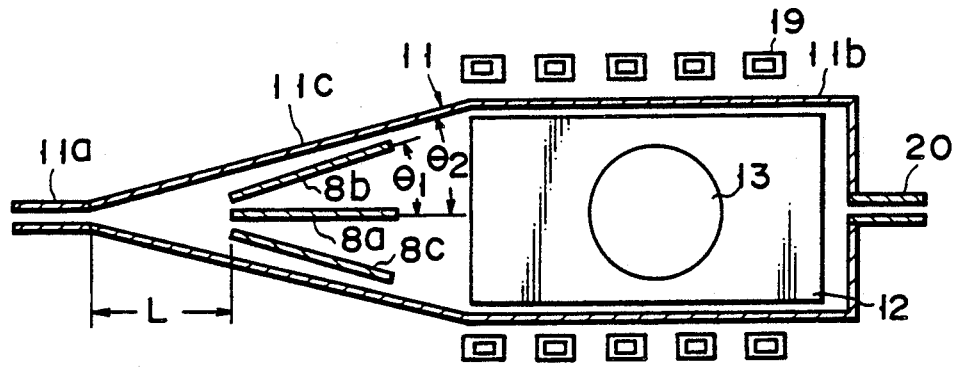
F I G. 2A
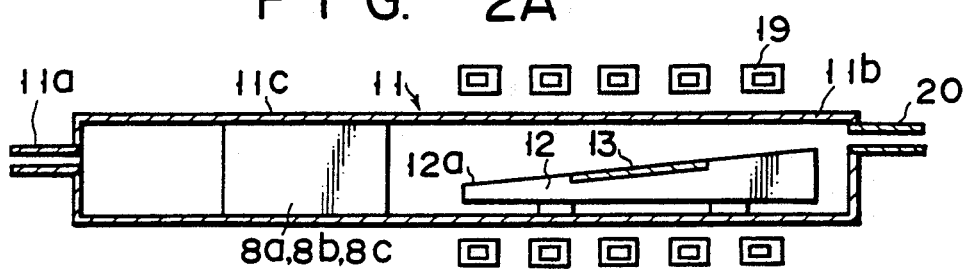
F I G. 2B

VAPOR GROWTH APPARATUS HAVING A DIFFUSER SECTION CONTAINING A FLOW REGULATING MEMBER

BACKGROUND OF THE INVENTION

1. Field of the Invention

The present invention relates to an apparatus for manufacturing semiconductor devices, and, in particular, to a vapor growth apparatus wherein a semiconductor crystal is grown by using an organometallic compound as a feed gas.

2. Description of the Related Art

Recently, apparatuses used in performing organometallic vapor growth methods have remarkably developed because of their simple structure and easy operation. The organometallic vapor growth methods are performed as shown in FIGS. 1A and 1B. Support or susceptor 2 made of carbon is disposed within reaction tube 1. Semiconductor wafer 3 is mounted on susceptor 2. A feed gas is introduced into reaction tube 1 through inlet 4. Wafer 3 is heated up to about 800° C. by frequency coil 5 arranged outside of reaction tube 1, thereby to grow a semiconductor crystal on wafer 3. In this case, by changing the compositions of the feed gas, a plurality of different-kind semiconductor crystal layers are formed on wafer 3.

In this type of organometallic vapor growth method, it is necessary that the thickness of each crystal layer be uniform over the entire surface of wafer 3, in order to obtain an excellent yield.

According to conventional method of keeping uniformity in thickness of the crystal layer in the direction of the flow of feed gas, wafer-supporting face 40 of susceptor 2 is inclined so that a gas flow path becomes thinner toward the downstream side, as shown in FIG. 1B. By this method, the gas component consumed for crystal growth on the upstream side of wafer 3 is compensated on the downstream side due to increase of flow speed. Thus, the uniformity in thickness of the crystal layer can be maintained.

In a direction perpendicular to the flow of feed gas, the flow speed of the feed gas reaches a maximum value at the central area of reaction tube 1, and becomes zero in the vicinity of the inner wall of reaction tube 1 owing to the viscosity resistance. In other words, even if the concentration of the gas component to be consumed by crystal growth is constant, the flow speed of feed gas varies over the cross section of reaction tube 1; consequently, the thickness of the crystal layer in the direction perpendicular to the flow of the feed gas is large in the central area of wafer 3 and small in the peripheral area of wafer 3.

In order to solve this problem, for example, the size of reaction tube 1 may be increased, and wafer 3 may be located in a region where a variation in flow speed is small. Alternatively, wafer 3 may be rotated by mechanical means. In the former method, when the size of the apparatus becomes large, a convection eddy current is easily caused. In order to prevent the occurrence of the convection eddy current, it is necessary to increase the flow rate of feed gas, resulting in a rise in manufacturing cost. On the other hand, the latter method wherein wafer 3 is rotated is a surer method, in fact. However, it is difficult to design a rotation mechanism bearing at a high temperature of about 1,000° C., and a special material must be used as a material constituting such a rotation mechanism. In addition, there are problems wherein solid material is precipitated on a rotational part of the rotation mechanism or the maintenance of the rotation mechanism is troublesome, compared to the conventional apparatus. Thus, the latter method is also disadvantageous.

SUMMARY OF THE INVENTION

An object of the present invention is to provide a vapor growth apparatus which can form a thin film of uniform thickness over the entire surface of a substrate.

According to the present invention, there is provided a vapor growth apparatus comprising:

a reaction chamber including a gas inlet, a diffuser section, the cross section of which gradually increases in a direction of the flow of gas supplied from the gas inlet, and a reaction section, which is coupled to the diffuser section and in which a substrate on which a thin film is to be formed is arranged; and a flow regulating member arranged, within the diffuser section, to make the flow speed of gas passing over the substrate uniform in a direction perpendicular to the direction of the flow of the gas.

In the present invention, the flow regulating member is arranged in the diffuser section in a specific manner, so that the flow speed of gas flowing over the substrate is made uniform in a direction perpendicular to the direction of the flow of the gas. As a result, a thin film can be uniformly formed on the substrate in a direction perpendicular to the direction of the flow of the gas.

BRIEF DESCRIPTION OF THE DRAWINGS

FIG. 2A is a horizontal cross section of a vapor growth apparatus according to an embodiment of the present invention;

FIG. 2B is a vertical cross section of the vapor growth apparatus of FIG. 2A;

DETAILED DESCRIPTION OF THE PREFERRED EMBODIMENTS

Figure 1A:
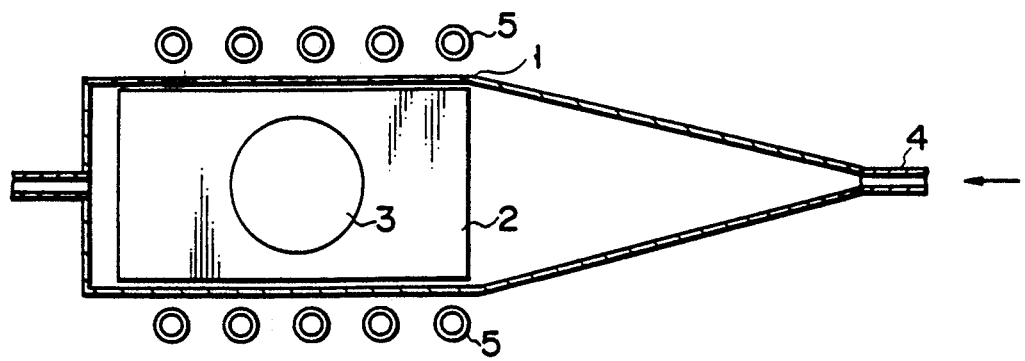
FIG. 1A is a horizontal cross section of a conventional vapor growth apparatus.
Figure 1B:
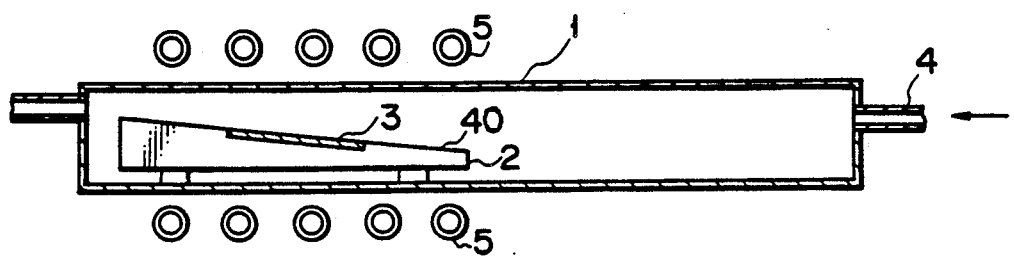
FIG. 1B is a vertical cross section of the conventional vapor growth apparatus.

Preferred embodiments of the present invention will now be described with reference to the accompanying drawings.

FIGS. 2A and 2B are horizontal and vertical cross sections of a vapor growth apparatus according to one embodiment of the invention. A feed gas or an organometallic compound gas, such as TMG (trimethylgallium) or GaAs (gallium arsenide), is introduced, together with a carrier gas such as $H_2$ (hydrogen) gas, into reaction chamber 11 through gas inlet 11a. Three flow regulating plates 8a, 8b and 8c are arranged in diffuser section 11c of reaction chamber 11, in a position apart from gas inlet 11a by distance L. Regulating plate 8a is located at the center of diffuser section 11c. Regulating plates 8b and 8c are symmetrical with respect to a central axis of diffuser section 11c, such that the angle $\theta_1$ between the central axis of reaction chamber 11 and each of regulating plates $\theta b$ and $\theta c$ is greater than the angle $\theta_2$ between the central axis of reaction chamber 11 and inner side surface of diffuser section 11c.

Susceptor 12 made of carbon is disposed within reaction section 11b of reaction chamber 11. One or more semiconductor wafers 13 are mounted on susceptor 12. The surface of susceptor 12 for supporting wafer 13 is so inclined that a flow passage of gas becomes narrow toward the downstream side. Susceptor 12 is heated at a predetermined temperature of about 800° C. by high frequency coil 19 arranged in the vicinity of reaction chamber 11. High frequency coil 19 is connected to a high frequency oscillator (not shown). The cross section of each turn of coil 19 is rectangular for achieving high thermal reflectivity and high heating efficiency.

The gas within reaction chamber 11 is discharged by a vacuum pump (not shown) connected to outlet 20. After harmful components are eliminated from the discharged gas by a discharge gas processing apparatus (not shown), the gas is released to the atmosphere.

Figure 3:
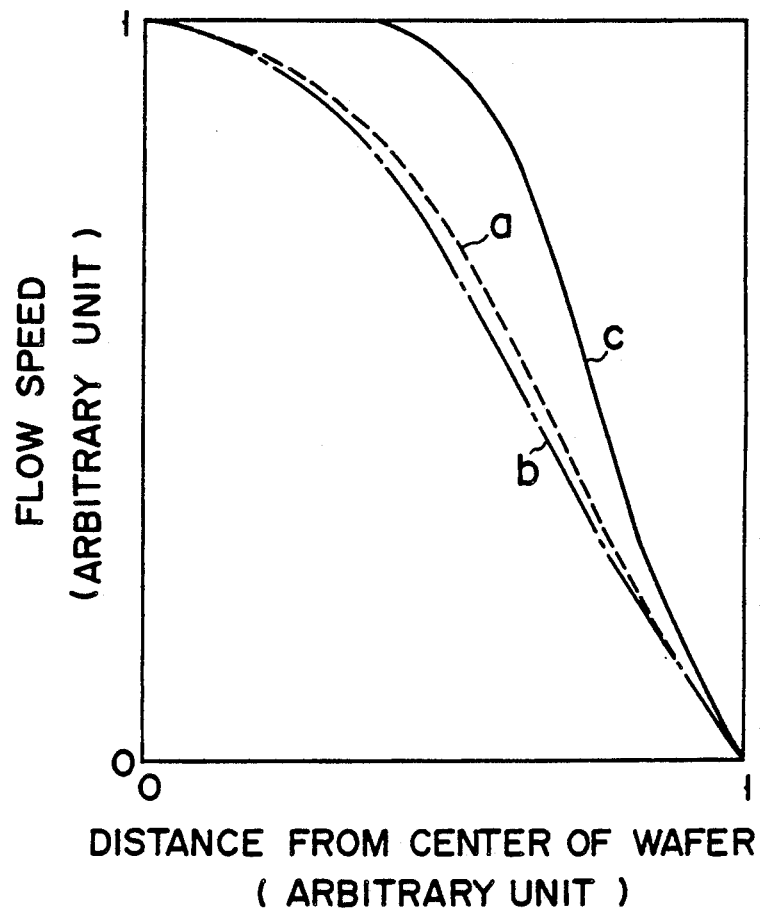
FIG. 3 is a graph showing a flow speed distribution of a gas within a reaction chamber.

The inventor examined, by numerical analysis, a flow speed distribution of gas at upstream end portion 12a of susceptor 12 in the above-described vapor growth apparatus. FIG. 3 shows the result of the numerical analysis. In FIG. 3, the ordinate indicates the flow speed of gas by an arbitrary unit, and the abscissa indicates the distance from the center of the reaction chamber. Curve a shows the case where the angle $\theta_1$ between the central axis of reaction chamber 11 and each of regulating plates 8b and 8c is equal to the angle $\theta_2$ between the central axis of reaction chamber 11 and each inner side faces of diffuser section 11c. Curve b shows the case where regulating plates 8b and 8c are not provided, and curve c shows the case where the angle $\theta_1$ between the central axis of reaction chamber 11 and each of regulating plates 8b and 8c is set to 15°, and the angle $\theta_2$ between the central axis of reaction chamber 11 and each inner side face of diffuser section 11c is more than 10°.

As shown in FIG. 3, in the case where the angle $\theta_1$ between the central axis of reaction chamber 11 and each of regulating plates 8b and 8c is equal to the angle $\theta_2$ between the central axis of reaction chamber 11 and each inner side face of diffuser section 11c (curve a), the effect is slightly better than, but substantially identical to, that obtainable in the case where regulating plates 8b and 8c are not provided (curve b). However, in the case (curve c) where the angle $\theta_1$ between the central axis of reaction chamber 11 and each of regulating plates 8b and 8c is set to 15°, and the angle $\theta_2$ between the central axis of reaction chamber 11 and each inner side face of diffuser section 11c is set to 10°, a remarkably uniform flow speed distribution can be obtained.

From the result of the analysis, it was also confirmed that the flow speed distribution can be made uniform even in the case where regulating plate 8a is not provided at the center of reaction chamber 11.

According to experiments, it was found desirable that the angle $\theta_1$ between the central axis of reaction chamber 11 and each of regulating plates 8b and 8c be greater than the angle $\theta_2$ between the central axis of reaction chamber 11 and each inner side face of diffuser section 11c by 2° to 10°.

Figure 4:
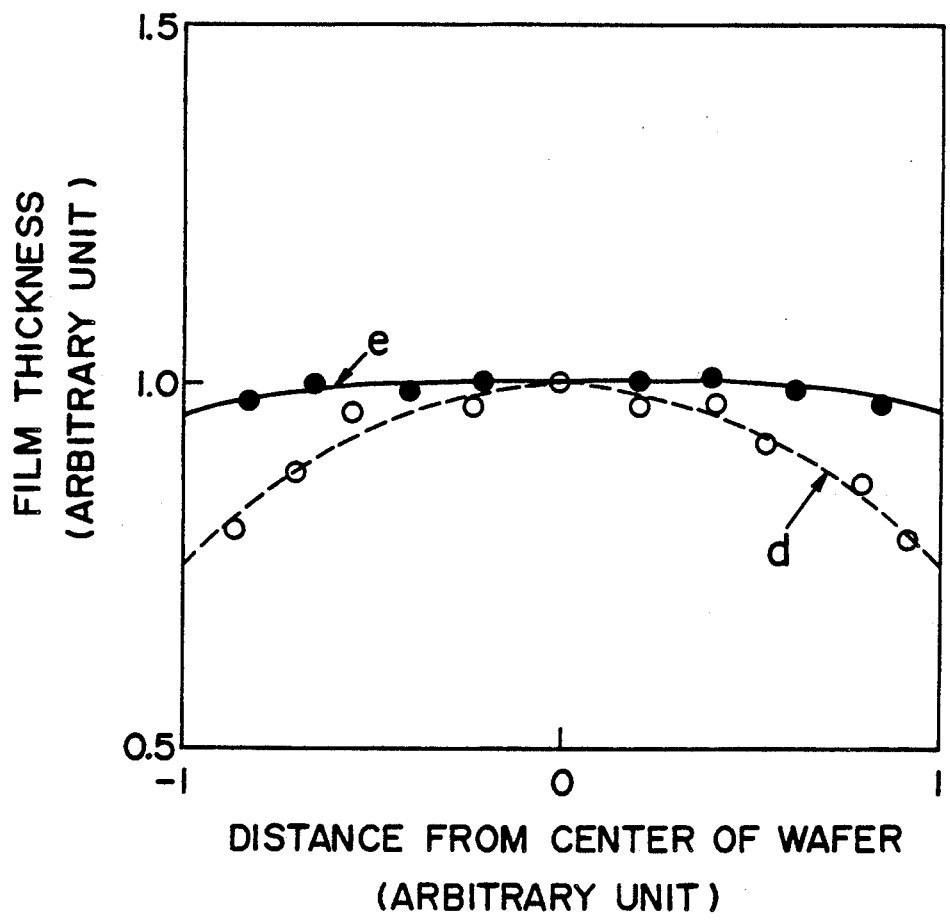
FIG. 4 is a graph showing a thickness distribution of an AsGa thin film formed on a substrate.

Curve e in FIG. 4 shows a thickness distribution of a thin film in the case where an AsGa thin film was formed on an AsGa wafer by using a vapor growth apparatus in which the angle $\theta_2$ between the central axis of reaction chamber 11 and each inner side face of diffuser section 11c was set to 10° and the angle $\theta_1$ between the central axis of reaction chamber 11 and each of regulating plates 8b and 8c was set to 15°. As seen from curve e, the thickness of the thin film is substantially uniform over the entire surface of the wafer. In contrast, according to a conventional vapor growth apparatus in which no flow regulating plate is provided, the thickness of the thin film decreases in a direction away from the center of the wafer. In this case, the conditions for vapor growth are that the pressure is 300 Torr. and the total flow rate of the feed gas (TMG) and carrier gas ($H_2$) is 10 l/min.

Figure 5:
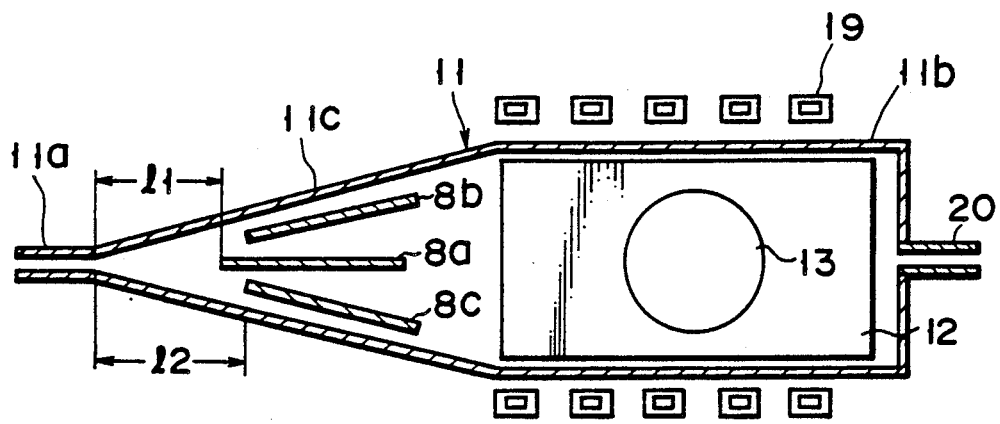
FIG. 5 is a horizontal cross section of a vapor growth apparatus according to another embodiment of the invention.

FIG. 5 is a horizontal cross section of a vapor growth apparatus according to another embodiment of the present invention. In the apparatus shown in FIGS. 2A and 2B, the angle $\theta_1$ between the central axis of reaction chamber 11 and each of regulating plates 8b and 8c is greater than the angle $\theta_2$ between the central axis of reaction chamber 11 and each inner side face of diffuser section 11c. On the other hand, in the apparatus shown in FIG. 5, the angle $\theta_1$ between the central axis of reaction chamber 11 and each of regulating plates 8b and 8c is substantially equal to the angle $\theta$ between the central axis of reaction chamber 11 and each inner side face of diffuser section 11c. In the apparatus of FIG. 5, middle regulating plate 8a is arranged closer to the gas inlet than both side plates 8b and 8c. Namely, the distances between the gas inlet and the regulating plates may be represented by:

$$l_1 < l_2$$

In this case, compared to the case of $l_1 = l_2$, it is possible to increase the flow speed of gas flowing near the inner surface of diffuser section 11c. As a result, the flow speed of gas flowing over the entire surface of wafer 13 can be made uniform. Needless to say, it is possible to make the angle $\theta_1$ between the central axis of reaction chamber 11 and each of regulating plates 8b and 8c greater than the angle $\theta_2$ between the central axis of reaction chamber 11 and each inner side face of diffuser section 11c.

Figure 6:
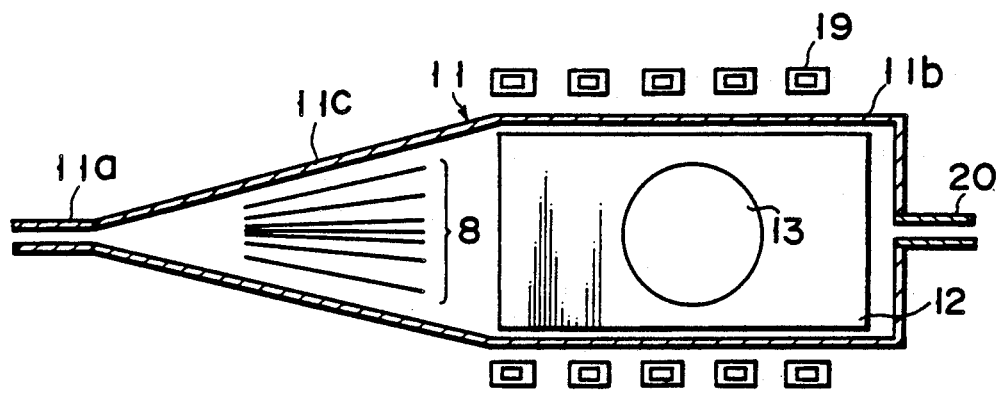
FIG. 6 is a horizontal cross section of a vapor growth apparatus according to still another embodiment of the present invention.

FIG. 6 is a horizontal cross section of a vapor growth apparatus according to still another embodiment of the present invention. In this apparatus, a number of regulating plates 8 are arranged such that arrangement density thereof is higher at the central area than at the peripheral area. With this arrangement, the flow speed of gas flowing at the central area of diffuser section 11c can be suppressed, so that the flow speed of gas flowing over the entire surface of the wafer can be made uniform.

In the above-described embodiments, the reaction chamber having a rectangular cross section was used. However, reaction chamber of any cross section, for example, a circular cross section, may be used. Also, in accordance with the shape of the diffuser section of the reaction chamber, the shape of the flow regulating plate may be changed, for example, to a triangular flat-plate shape, a fan-like flat-plate shape, a conical shape, etc. Thus, the flow regulating plate may be a conical sleeve having a cross section increasing gradually in the direction of the flow of the gas, and the side walls of the diffuser section may be included with respect to the central axis of the reaction chamber. In this case, the first angle between a generating line of the conical sleeve and the central axis of the reaction chamber is wider than the second angle between the side wall of the diffuser section and the central axis of the reaction chamber.

It is conventionally said that the rate of crystal growth using an organometallic compound as feed gas is dominated by the supply of the feed gas. Namely, the flow speed distribution of gas passing over a susceptor is suggestive of the tendency of variation in thickness of a grown film. Thus, if the flow speed distribution of the gas passing over the susceptor were uniform, the film thickness would become constant.

The material of the flow regulating plate may be identical to that of the reaction chamber, for example, quartz glass. Thus, the vapor growth apparatus of the present invention has a simple structure and can be manufactured at a very low cost.

As described above, according to the vapor growth apparatus of the present invention, the structure of the apparatus can be simplified, the manufacturing cost of the apparatus can be reduced, and a thin film can be formed on a substrate such that the thickness of the film is uniform over the entire surface of the substrate.

What is claimed is:

1. A vapor growth apparatus comprising:
a reaction chamber including a gas inlet, a diffuser section, the cross section of which gradually increases in a direction of flow of gas supplied through said gas inlet, and a reaction section which is coupled to said diffuser section and in which a substrate is arranged on which a thin film is to be formed; and
a flow regulating member including at least a pair of first plates which are arranged vertically substantially in the direction of gas flow, and substantially symmetrically within said diffuser section and separated from each other in a direction perpendicular to the direction of flow of the gas supplied through said gas inlet, so as to render the flow speed of the gas through said reaction section substantially uniform, said first plates being positioned at a first angle with respect to the central axis of said reaction chamber.

2. The apparatus according to claim 1, wherein said flow regulating member comprises number of plates which are arranged vertically, and substantially in a direction of the flow of the gas, the arrangement density of said pates being higher near the central axis of the reaction chamber than near inner walls of said diffuser section.

3. The apparatus according to claim 1, wherein said flow regulating member comprises a conical sleeve having a cross section increasing gradually in the direction of the flow of the gas, side walls of said diffuser section are angled with respect to the central axis of said reaction chamber, and a first angle between a generating line of said conical sleeve and the central axis of the reaction chamber is greater than a second angle between said side wall of the diffuser section and the central axis of the reaction chamber.

4. The apparatus according to claim 3, wherein said first angle is greater than said second angle by 2° to 10°

5. The vapor growth apparatus according to claim 1, wherein said first angle is greater than a second angle defined by a side wall of said diffuser section and the diffuser section 11c was set to 10° and the angle 01 central axis of said reaction chamber.

6. The vapor growth apparatus according to claim 5, wherein said first angle is greater than said second angle by 2° to 10°.

7. The vapor growth apparatus according to claim 1, wherein said flow regulating member further includes a central plate arranged vertically along the central axis of said reaction chamber, and a pair of second plates arranged vertically and substantially symmetrically and separated from each other in a direction perpendicular to the direction of flow of the gas supplied through said gas inlet, said second plates being positioned at the first angle with respect to the central axis of said reaction chamber.

8. The apparatus according to claim 7, wherein an upstream end portion of said central plate is closer to said gas inlet than are upstream end portions of said second plates.

9. The vapor growth apparatus to claim 1, wherein said flow regulating member is arranged so that the direction of flow of the gas passing over said substrate is substantially coplanar with a surface of said substrate, and the flow speed of the gas flowing over said substrate is substantially uniform from its upstream to its downstream over substantially the entirety of said substrate surface.

10. A vapor growth apparatus comprising:
a reaction chamber including a gas inlet, a diffuser section, the cross section of which gradually increases in a direction of flow of gas supplied through said gas inlet, and a reaction section which is coupled to said diffuser section and in which a substrate is arranged on which a thin film is to be formed; and
a flow regulating member including at least a pair of plates which are arranged vertically substantially in the direction of gas flow, symmetrically within said diffuser section and separated from each other in a direction perpendicular to the direction of flow of the gas supplied through said gas inlet, so as to increase the flow speed of the gas passing over a peripheral area of said substrate, said plates being positioned at a first angle with respect to the central axis of said reaction chamber.

11. A vapor growth apparatus comprising:
a reaction chamber including a gas inlet, a diffuser section, the cross section of which gradually increases in a direction of flow of gas supplied through said gas inlet, and a reaction section which is coupled to said diffuser section and in which a substrate is arranged on which a thin film is to be formed; and
a flow regulating member including at least a pair of plates which are arranged vertically substantially in the direction of gas flow, symmetrically within said diffuser section and separated from each other in a direction perpendicular too the direction of flow of the gas supplied through said gas inlet, so as to decrease the flow speed of the gas passing over a central area of said substrate, said plates being positioned at a first angle with respect to the central axis of said reaction.

* * * * *

UNITED STATES PATENT AND TRADEMARK OFFICE
CERTIFICATE OF CORRECTION

PATENT NO.　：　4,993,360

DATED　　　：　February 19, 1991

INVENTOR(S)：　Yoshiaki Nakamura

It is certified that error appears in the above-identified patent and that said Letters Patent is hereby corrected as shown below:

On the title page, item [73]:

The first word in the Assignee's name is spelled incorrectly,"Kasbushiki", should be --Kabushiki--

Signed and Sealed this

Eleventh Day of August, 1992

Attest:

DOUGLAS B. COMER

Attesting Officer　　　Acting Commissioner of Patents and Trademarks